(12) United States Patent
Ito et al.

(10) Patent No.: US 10,415,793 B2
(45) Date of Patent: Sep. 17, 2019

(54) ILLUMINATION APPARATUS

(75) Inventors: Yasushi Ito, Tochigi (JP); Yoshifumi Ueno, Tochigi (JP); Hirofumi Tani, Tochigi (JP); Tomomitsu Hori, Tochigi (JP)

(73) Assignee: DEXERIALS CORPORATION, Tokyo (JP)

(*) Notice: Subject to any disclaimer, the term of this patent is extended or adjusted under 35 U.S.C. 154(b) by 101 days.

(21) Appl. No.: 14/110,796

(22) PCT Filed: Jul. 5, 2012

(86) PCT No.: PCT/JP2012/067177
§ 371 (c)(1),
(2), (4) Date: Oct. 9, 2013

(87) PCT Pub. No.: WO2013/005792
PCT Pub. Date: Jan. 10, 2013

(65) Prior Publication Data
US 2014/0029238 A1    Jan. 30, 2014

(30) Foreign Application Priority Data
Jul. 5, 2011 (JP) ................... 2011-149291

(51) Int. Cl.
*F21V 9/00* (2018.01)
*G02F 1/1335* (2006.01)
(Continued)

(52) U.S. Cl.
CPC .......... *F21V 9/00* (2013.01); *G02F 1/133603* (2013.01); *H01L 33/507* (2013.01);
(Continued)

(58) Field of Classification Search
CPC ..... F21V 9/00; F21V 9/16; F21V 9/32; G02F 1/133603; G02F 1/133606; G02F 1/133609; G02F 2001/133614
(Continued)

(56) References Cited

U.S. PATENT DOCUMENTS 7,355,339 B2 * 4/2008 Okinaka ............. H01L 51/5265
257/98
2008/0259641 A1 * 10/2008 Suzuki ................... G02B 5/045
362/612
(Continued)

FOREIGN PATENT DOCUMENTS

CN    101883947 A    11/2010
EP    1858303 A2    11/2007
(Continued)

OTHER PUBLICATIONS

Jan. 7, 2014 International Preliminary Report on Patentability issued in International Patent Application No. PCT/JP2012/067177.
(Continued)

*Primary Examiner* — Zheng Song
(74) *Attorney, Agent, or Firm* — Oliff PLC

(57) ABSTRACT

Provided is an illumination device that can be made thin and increases the efficiency of extracting light to the outside. The present invention is provided with: light-emitting structures wherein a blue light-emitting element is embedded in a transparent resin having a convex surface shape; a substrate wherein the light-emitting structures are disposed two-dimensionally; a diffuser plate that diffuses the blue light of the blue light-emitting elements; and a fluorescent sheet that is disposed spaced from the substrate and that contains a particulate fluorescent body that obtains a white light from the blue light of the blue light-emitting elements.

7 Claims, 16 Drawing Sheets

(51) Int. Cl.
*H01L 33/50* (2010.01)
*F21V 9/32* (2018.01)
*F21Y 113/17* (2016.01)
*H01L 25/075* (2006.01)
*H01L 33/48* (2010.01)
*H01L 33/54* (2010.01)

(52) U.S. Cl.
CPC ............ *F21V 9/32* (2018.02); *F21Y 2113/17* (2016.08); *G02F 1/133606* (2013.01); *G02F 2001/133614* (2013.01); *H01L 25/0753* (2013.01); *H01L 33/486* (2013.01); *H01L 33/504* (2013.01); *H01L 33/54* (2013.01); *H01L 2924/0002* (2013.01)

(58) Field of Classification Search
USPC ............... 362/230, 600–634, 97.1–97.4, 84; 257/98, 100
See application file for complete search history.

(56) References Cited

U.S. PATENT DOCUMENTS

| | | | |
|---|---|---|---|
| 2009/0195730 A1* | 8/2009 | Park | G02F 1/133609 349/71 |
| 2009/0290339 A1* | 11/2009 | Chang | G02F 1/133603 362/231 |
| 2010/0149783 A1* | 6/2010 | Takenaka | F21K 9/00 362/84 |
| 2010/0165624 A1* | 7/2010 | Ogawa | F21S 8/02 362/235 |
| 2010/0188613 A1 | 7/2010 | Tsukahara et al. | |
| 2010/0238648 A1* | 9/2010 | Tsukahara | G02F 1/133603 362/97.1 |
| 2010/0245711 A1* | 9/2010 | Kubota | G02F 1/133603 349/61 |
| 2010/0246160 A1 | 9/2010 | Ito et al. | |
| 2011/0037926 A1 | 2/2011 | Tsukahara et al. | |
| 2011/0058378 A1* | 3/2011 | Mei | B29D 11/00028 362/296.01 |
| 2011/0222280 A1* | 9/2011 | Kim | H01L 33/58 362/235 |
| 2012/0113672 A1* | 5/2012 | Dubrow | B82Y 20/00 362/602 |
| 2012/0256213 A1* | 10/2012 | Chang | H01L 33/54 257/98 |
| 2013/0020601 A1* | 1/2013 | Daicho | C09K 11/7734 257/98 |

FOREIGN PATENT DOCUMENTS

| | | |
|---|---|---|
| EP | 1947670 A2 | 7/2008 |
| JP | 2006-308859 A | 11/2006 |
| JP | A-2007-023267 | 2/2007 |
| JP | A-2009-140829 | 6/2009 |
| JP | 2009-212508 A | 9/2009 |
| JP | A-2009-283438 | 12/2009 |
| JP | A-2009-283441 | 12/2009 |
| JP | A-2010-171342 | 8/2010 |
| JP | A-2010-238866 | 10/2010 |
| JP | A-2011-124189 | 6/2011 |

OTHER PUBLICATIONS

Feb. 27, 2015 Search Opinion issued in European Patent Application No. 12807660.1.
Feb. 27, 2015 Supplementary Search Report issued in European Patent Application No. 12807660.
Aug. 7, 2012 International Search Report issued in International Application No. PCT/JP2012/067177.
Feb. 3, 2016 Office Action issued in Chinese Application No. 201280033218.6.

* cited by examiner (A)

(B)

(A)

(B)

(A)

(B)

(A)

(B)

(A)

(B)

(A) 37mm (B) 34mm (C) 29mm (D) 24mm (A) 37mm (B) 34mm (C) 29mm (D) 24mm

ILLUMINATION APPARATUS

TECHNICAL FIELD

This invention relates to an illumination apparatus used in a display device such as a liquid crystal display. This application claims priority to Japanese Patent Application No. 2011-149291, filed on Jul. 5, 2011, which is incorporated herein by reference.

DESCRIPTION OF THE RELATED ART

In liquid crystal displays, light sources are used that illuminate liquid crystal panel from the back side of the panel. In recent years, due to the increased size, reduced thickness and weight, and elongated life-time of liquid crystal displays, and in view of the improvement in motion picture properties by using on/off control, light emitting devices having a plurality of light emitting diodes (LEDs) on a substrate for surface emission have attracted much attention. In these light emitting devices, mainly two approaches are used to obtain white light as described below.

The first approach is performed by arranging LEDs emitting three colors (R, G and B) of light, turning on them simultaneously and adding these three colors of light to obtain white light. The second approach is performed, for example, by embedding a blue LED in a phosphor-containing resin and converting the color from blue light to white light. This structure in which a blue LED is embedded in a phosphor-containing resin is called a "white LED".

Since the first approach requires LEDs emitting three colors of R, G and B, the cost thereof is relatively high. On the other hand, the second approach involves potting of the phosphor onto micro area of the LED, making it difficult to form the phosphor-containing resin uniformly without unevenness.

More recently, therefore, an approach sandwiching a phosphor-containing resin with sheet-shaped base materials or an approach using a phosphor-containing sheet formed by processing a phosphor-containing resin into a sheet to convert the color of blue LED has come to draw a lot of attention as the third approach alternative to the second approach (see, for example, PLT 1 and 2). In addition, a structure in which a phosphor-containing resin is sandwiched by two glass plates has also been proposed (see, for example, PLT 3).

This structure is called "remote phosphor structure" since the blue LED and the phosphor-containing resin are disposed so as not to contact with each other. This "remote phosphor structure" can be used not only as a back light for liquid crystal displays but also as a light source for illumination. When using this as a light source for illumination, the phosphor-containing resin may have a three-dimensional shape such as a cup-like shape instead of the above mentioned planar sheet shape.

In general, the most important and everlasting subject of light sources is how to improve the luminous efficiency thereof. In the case of a light source for back light or a light source for illumination using LEDs, it is desirable (1) to improve the efficiency of the blue LED itself (quantum efficiency for converting electrons or holes into light), (2) to improve the efficiency of the phosphor (wavelength conversion efficiency of light emitted from the LED) and (3) to improve the efficiency of extracting light emitted from the LED or the phosphor to the outside with minimum loss at any position inside the light source.

In the case of "white LED" in which an LED is embedded in a phosphor-containing resin, since the LED chip and the phosphor contact with or close to each other, heat generated at the same time of LED light emission can be easily conducted to the phosphor to increase the temperature thereof. Increased temperature of the phosphor will reduce the wavelength conversion efficiency of the phosphor. This phenomenon is called "temperature quenching". FIG. 17 shows measured data of temperature quenching of a $Y_3AlO_{12}$:Ce(YAG) phosphor.

On the other hand, in the case of "remote phosphor structure" using the third approach as described in PLT 1 and 2, for example, since the LED and the phosphor-containing resin are disposed so as not to contact with each other, the heat generated at the same time of LED light emission is hardly conducted to the phosphor such that the temperature of the phosphor hardly increases. Consequently, in this case, reduction of phosphor wavelength conversion efficiency is less than the case of the "white LED". This is one of advantages of the "remote phosphor structure". Prior arts of PLT 1 and 2 capable of utilizing this advantage are very desirable technologies.

CITATION LIST

Patent Literatures

PTL 1: Japanese Unexamined Patent Publication No. 2009-283438
PTL 2: Japanese Unexamined Patent Publication No. 2010-171342
PTL 3: Japanese Unexamined Patent Publication No. 2007-23267

SUMMARY OF THE INVENTION

Technical Problem

In the so-called "remote phosphor structure" disclosed in PTL 1 to 3, however, efficiency of extracting light to the outside as mentioned in (3) is insufficient. Furthermore, the thickness of the "remote phosphor structure" is difficult to be reduced due to the separation of the LED and the phosphor-containing structure.

Having regard to the above, an object of the present invention is to provide an illumination apparatus capable of improving efficiency of extracting light to the outside and reducing the thickness.

Means for Solving the Problem

To solve the above-mentioned problems, an illumination apparatus according to the present invention includes light-emitting structures in which a blue light-emitting element is embedded in a transparent resin having a convex surface shape, a substrate on which the light-emitting structures are disposed two-dimensionally, and a phosphor sheet disposed at a position spaced from the substrate and containing phosphor particles that obtain white light from blue light of the blue light-emitting element.

In addition, a display apparatus according to the present invention includes the above described illumination apparatus disposed at an image display panel.

Effect of the Invention

This invention suppress light confinement effect of blue light caused by total reflection of transparent resin by convex surface shape of the transparent resin to improve efficiency of extracting blue light to the outside. Furthermore, owing to the light-radiation distribution broadened by the convex surface shape of the transparent resin and the light-scattering effect of the phosphor sheet containing phosphor particles, the gap distance between the substrate and the phosphor sheet can be small such that the thickness of the device having so-called "remote phosphor structure" can be reduced.

DESCRIPTION OF EMBODIMENTS

Embodiments of the present invention will now be described in the following order.
1. Exemplary Configuration of Illumination Apparatus
2. Examples
<1. Exemplary Configuration of Illumination Apparatus>

Figure 1:
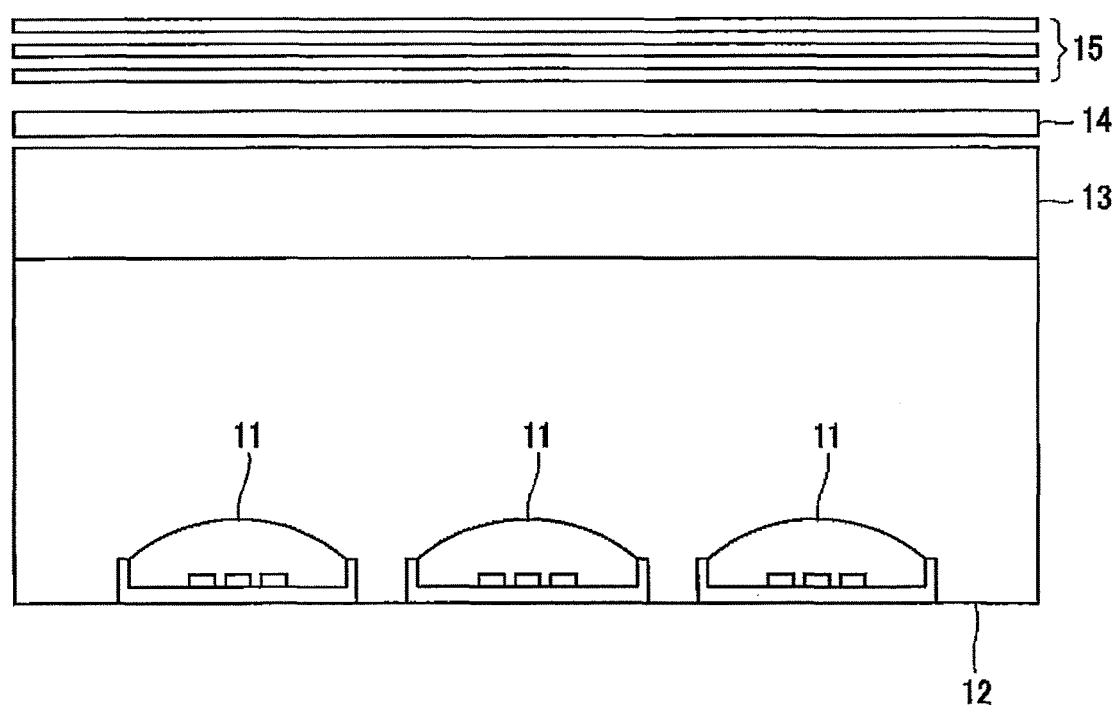
FIG. 1 is a schematic cross-sectional view of an illumination apparatus according to an embodiment of the present invention.

FIG. 1 is a schematic cross-sectional view of an illumination apparatus according to an embodiment of the present invention. As shown in FIG. 1, this illumination apparatus comprises light-emitting structures 11 in which a blue light-emitting element is embedded in a transparent resin having a convex surface shape, a substrate 12 on which the light-emitting structures 11 are disposed two-dimensionally, a diffuser plate 13 that diffuses the blue light of the blue light-emitting element, a phosphor sheet 14 disposed at a position spaced from the substrate 12 and containing phosphor particles that obtain white light from the blue light of the blue light-emitting element and an optical film 15.

The substrate 12 and the phosphor sheet are spaced by approximately 10 to 50 mm, so that this illumination apparatus constitutes a so-called "remote phosphor structure". The gap between the substrate 12 and the phosphor sheet 14 is kept by a plurality of supporting columns and reflective plates that surround all four sides of the space defined by the substrate 12 and the phosphor sheet 14.

The light-emitting structures 11 constitute a so-cold "LED package" having InGaN type blue light-emitting diode (LED) as a blue light-emitting element, for example.

Figure 2:
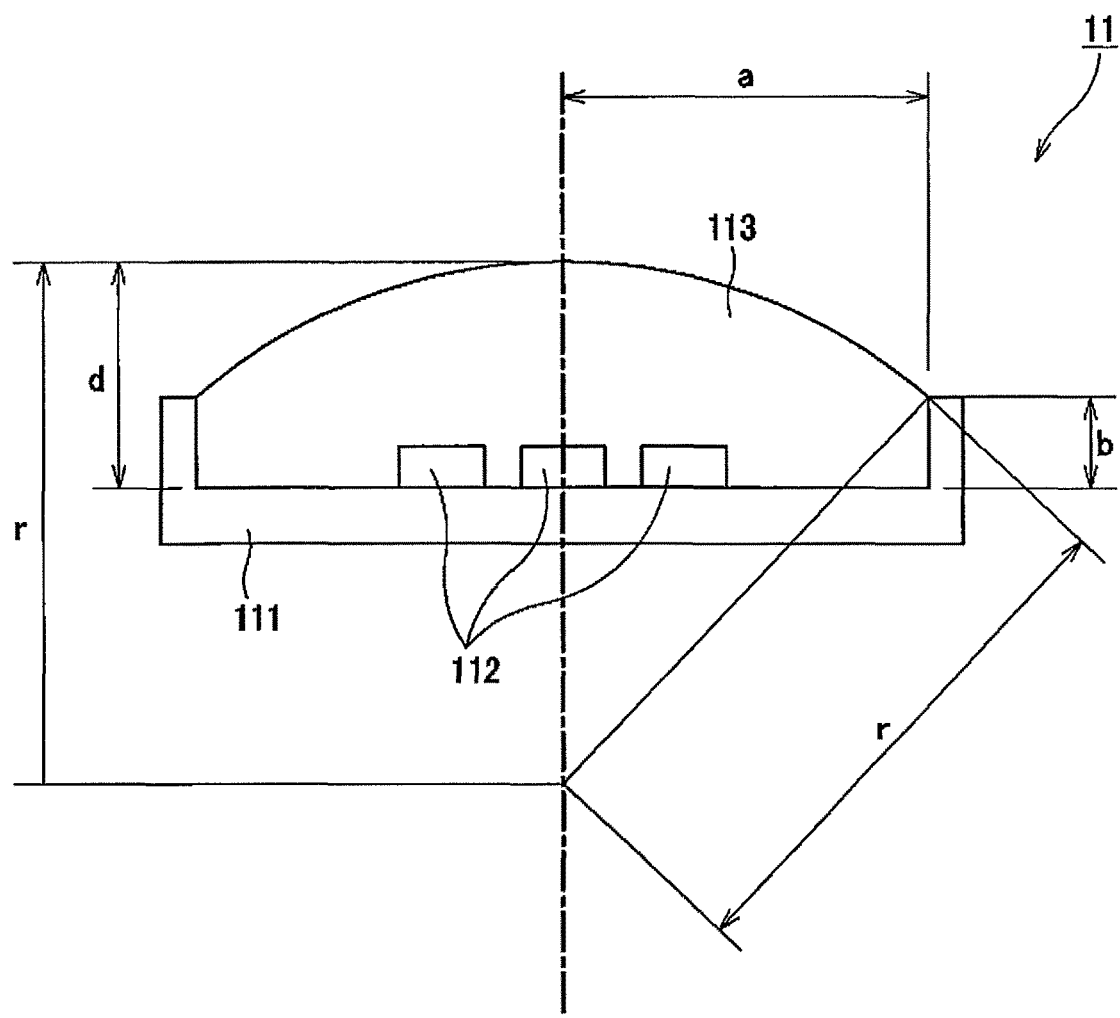
FIG. 2 is a schematic cross-sectional view of an exemplary configuration of the light-emitting structure.

FIG. 2 is a schematic cross-sectional view of an exemplary configuration of the light-emitting structure 11. This light-emitting structure 11 comprises abase material 111, a blue LED chip 112 as the blue light-emitting element and a transparent resin 113. At peripheral edges of the base material 111, side walls are provided so that the transparent resin 113 will have a convex surface shape.

The cross section of the base material 111 is lens-like shape having a curved surface and the ratio of half value of the width of the surface mounting the blue LED chip 112 on the base material (the distance between the center of the base material and an inner wall) "a" and the radius of curvature "r", that is, r/a is preferably 4.0 or less and more preferably 1.7 or less. The ratio r/a of 4.0 or less can suppress light confinement effect of blue light caused by total reflection of the transparent resin 113, thus improving efficiency of extracting blue light to the outside. Furthermore, this can achieve a broad light-radiation distribution such that the thickness of the so-called "remote phosphor structure" can be reduced.

In addition, the height b of the inner wall formed at peripheral edges of the base material 111 is equal to or greater than the thickness of the blue LED chip 112 and the height d of the transparent resin 113 is greater than the height b of the inner wall. It should be noted that the inner walls of the peripheral edges of the base material 111 can be omitted; in this case, since r/a of 1.7 or less is difficult to be achieved by using the potting method that is widely spread as a transparent resin forming method, another method such as transparent resin molding using a metal mold is required.

The substrate 12 constituting the illumination apparatus is formed of a glass fabric base material utilizing a resin such as phenol, epoxy, polyimide, polyester, bismaleimide triazine, and allylated polyphenylene oxide. On the substrate 12, the light-emitting structures 11 are disposed two-dimensionally in an area corresponding to the entire surface of the phosphor sheet 14. A surface of the substrate 12 on which the light-emitting structures 11 is mounted may be processed so that it will have a reflectivity, if necessary.

The diffuser plate 13 diffuses radiated light from the light-emitting structure 11 broadly to an extent in which the shape of the light source is invisible. A diffuser plate having a total light transmittance in the range of 20 to 80% is used as the diffuser plate 13.

The phosphor sheet 14 contains phosphor particles capable of obtaining white light from the blue light of the blue light-emitting element. The phosphor particles have an average diameter of several to several tens of micrometers. This average diameter improves the light-scattering effect of the phosphor sheet 14.

Figure 3:
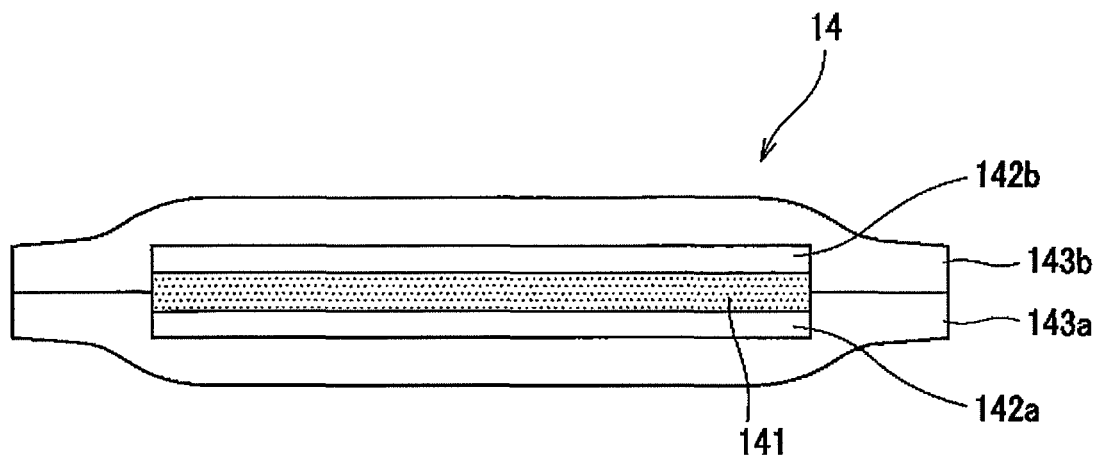
FIG. 3A illustrates an exemplary configuration of single-layered phosphor sheet and FIG. 3B illustrates an exemplary configuration of two-layered phosphor sheet.
Figure 3:
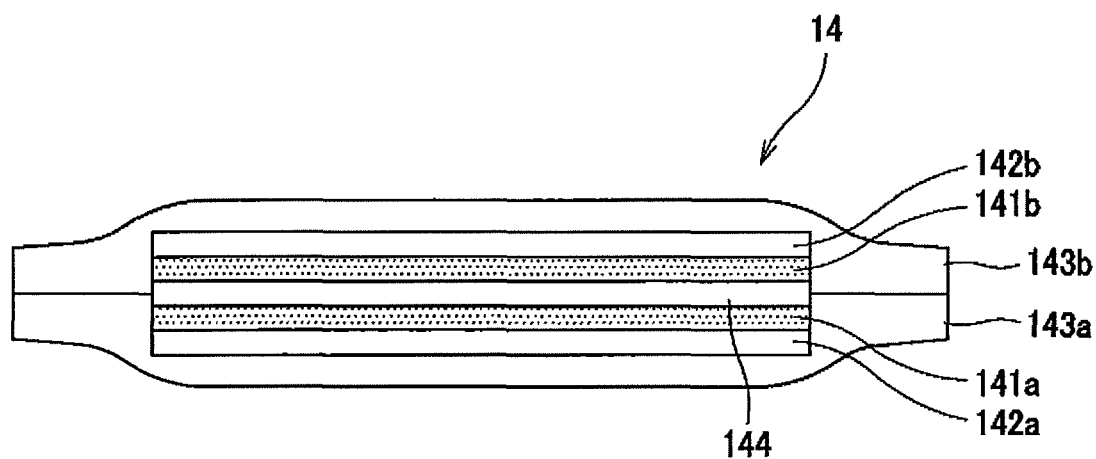

FIGS. 3A and 3B illustrate exemplary configurations of the phosphor sheet 14. In the phosphor sheet 14 shown in FIG. 3A, a phosphor layer 141 containing a phosphor is sandwiched between a pair of transparent base materials 142a and 142b formed of polyethylene terephthalate (PET), for example. Both sides of them are laminated with sealing films 143a and 143b. This prevents water from entering into the phosphor layer 141.

The phosphor sheet 14 having single layer shown in FIG. 3A can be manufactured by forming the phosphor layer 141 on the transparent base material 142a and then laminating another transparent base material 142b thereon. The manufacturing of the phosphor sheet 14 is completed by sandwiching it between the sealing films 143a and 143b and then bonding them altogether by thermocompression.

Alternatively, as shown in FIG. 3B, a plurality of phosphor layers 141a and 141b separated by a transparent separator 144 may be provided for every phosphor. In the case of using a plurality of phosphors, this constitution can suppress undesirable reaction and thus extending life-time of the phosphor sheet.

The phosphor layer 141 is a deposited film of a resin composition containing phosphor particles. The phosphor may be a sulfide-based phosphor, an oxide-based phosphor or a mixture thereof.

The sulfide-based phosphor includes a sulfide-based phosphor having a red fluorescence peak in the wavelength range of 620 to 660 nm when illuminated with a blue excitation light such as CaS:Eu and SrS:Eum, or a sulfide-based phosphor having a green fluorescence peak in the wavelength range of 530 to 550 nm when illuminated with a blue excitation light such as $SrGa_2S_4$:Eu. It should be noted that, in this notation of the phosphor material, the substance before ":" indicates a parent material and the substance after ":" indicates an activator.

The oxide-based phosphor includes a oxide-based phosphor emitting a red fluorescence light in the wavelength range of 590 to 620 nm when illuminated with a blue excitation light such as $(BaSr)_3SiO_5$:Eu and $(BaSr)_2SiO_4$:Eu.

It should be noted that phosphors other than the sulfide-based phosphor and the oxide-based phosphor, such as $(YGd)_2(AlGa)_5O_{12}$:Ce and sialon(SiAlON) phosphor may be used in combination with a resin composition described below.

In the phosphor sheet 14 shown in FIG. 3A, when using a mixture of the above-described phosphors as phosphors for the phosphor sheet 14, it is preferable to use a mixed phosphor of a sulfide-based phosphor emitting a red fluorescence light in the wavelength range of 620 to 660 nm with a blue excitation light or a oxide-based phosphor emitting a red fluorescence light in the wavelength range of 590 to 620 nm with a blue excitation light, and a sulfide-based phosphor emitting a green fluorescence in the wavelength range of 530 to 550 nm light with a blue excitation light in order to obtain white light from the phosphor sheet 14. One of the most preferable combination is a mixed phosphor of CaS:Eu or $(BaSr)_3SiO_5$:Eu emitting a red fluorescence light and $SrGa_2S_4$:Eu emitting a green fluorescence light.

On the other hand, in the two-layered phosphor sheet 14 shown in FIG. 3B, when using the above-described phosphors as phosphors for the phosphor sheet 14, it is preferable to use a phosphor layer of a sulfide-based phosphor emitting a red fluorescence light in the wavelength range of 620 to 660 nm with a blue excitation light or a oxide-based phosphor emitting a red fluorescence light in the wavelength range of 590 to 620 nm with a blue excitation light, and a phosphor layer of a sulfide-based phosphor emitting a green fluorescence light in the wavelength range of 530 to 550 nm with a blue excitation light. One of the most preferable combination is a combination of a phosphor layer containing CaS:Eu or $(BaSr)_3SiO_5$:Eu emitting a red fluorescence light and a phosphor layer containing $SrGa_2S_4$:Eu emitting a green fluorescence light.

The resin composition constituting the phosphor layers preferably contains a resin component selected from the group consisting of a polyolefin copolymer component and a light curing (meth) acrylic resin component.

The polyolefin copolymer includes a styrenic copolymer and hydrogenated copolymer thereof. Preferable styrenic copolymer and hydrogenated copolymer thereof includes styrene-ethylene-butylene-styrene block copolymer and hydrogenated copolymer thereof or styrene-ethylene-propylene block copolymer and hydrogenated copolymer thereof. Among these, hydrogenated copolymer of styrene-ethylene-butylene-styrene block copolymer is most preferably used in view of transparency and gas barrier property. By containing this kind of polyolefin copolymer, an excellent light stability and a low water absorbency can be achieved.

Preferable light curing (meth) acrylic resin component includes urethane (meth) acrylate, polyester (meth) acrylate and epoxy (meth) acrylate, and among these, urethane (meth) acrylate is most preferably used in view of heat-resisting property after light curing. By containing this kind of light curing (meth) acrylic resin component, an excellent light stability and a low water absorbency can be achieved.

In the case of using polyolefin copolymer component as a resin component, it preferably contains maleic anhydride component. The contained maleic anhydride component captures water molecules entered within the resin composition with free carboxyl groups thereof, thus preventing degradation of phosphor caused by moisture. In addition, contained polyolefin copolymer component and maleic anhydride component will improve light-diffusing effect of the phosphor sheet 14.

This maleic anhydride component may be added as a component independent from the polyolefin copolymer component (external addition) or added as a component graft polymerized with the polyolefin copolymer component (internal addition). In the case of internal addition, the resin composition for film deposition will contain a maleic anhydride modified polyolefin copolymer. It should be noted that external addition is more preferable than internal addition since external addition can suppress yellowing of the resin composition for film deposition better than internal addition.

Furthermore, other light-transmissive resins, color pigments and solvents may be blended with the resin composition, if necessary, as long as the effect of the present invention is obtained.

The optical film 15 constituting the illumination apparatus is comprised of a reflective polarizing film, a lens film or a diffusing film in order to improve the visibility of a liquid crystal display device, for example. The lens film is an optical film in which micro lenses are arranged on one surface in order to increase directivity of diffused light in frontal direction to improve brightness.

In the illumination apparatus having this constitution, the convex surface shape of the transparent resin 113 of the light-emitting structure 11 can suppress light confinement effect of blue light caused by total reflection of the transparent resin 113, thus improving efficiency of extracting blue light to the outside. In addition, owing to the light-radiation distribution broadened by the light-emitting structure 11 and the light-scattering effect of the phosphor sheet 14, the gap distance between the substrate and the phosphor sheet can be small such that the thickness of the apparatus having so-called "remote phosphor structure" can be reduced. Furthermore, by arranging the illumination apparatus of this embodiment to form a liquid crystal panel for a display screen of liquid crystal display device, for example, the thickness of the liquid crystal display device can be reduced.

It should be noted that the present invention is not limited to the embodiments described above and various modification can be added to the embodiment without departing from the scope of the present invention. For example, although the embodiment described above shows an example in which the illumination apparatus is applied to a light source for back light of a display device, the illumination apparatus may be applied to a light source for illumination. When appling the illumination apparatus to a light source for illumination, the optical film 15 is not necessary and the phosphor-containing resin may have a three-dimensional shape such as a cup-like shape in addition to a planar sheet shape.

EXAMPLES

2. Examples

In the following, the present invention will be described in detail with reference to some examples. It should be noted that these examples do not limit the scope of the present invention.

<Evaluation of Convex Surface Shape of LED Package>

Convex surface shapes were evaluated by using blue LED package and white LED package each having the same structure as the light-emitting structure shown in FIG. 2. In both packages, the distance between the center of the base material 111 and an inner wall "a" was 2.15 mm and the height of the inner wall "b" was 0.85 mm. A methylsilicone resin was used as the transparent resin 113 and, in the white LED package, a YAG phosphor was contained in the methylsilicone resin. The content of the YAG phosphor was adjusted so that the chromaticity of every white LED package is approximately (x, y)=(0.338, 0.400). The convex surface shapes of every LED package was evaluated by a total luminous flux measurement device using an integrating sphere and total radiant quantity (W) was measured as emission intensity.

Table 1 shows measurement results of relative emission intensities of blue LED packages with regards to resin shapes. Table 2 shows measurement results of relative emission intensities of white LED packages with regards to resin shapes. The resin shapes are expressed by the ratio r/a, wherein "a" is a half value of the width of the transparent resin in contact with the base material and "r" is a radius of curvature. The relative emission intensities are shown as a relative value against a naked state of the LED chip, in other words, a state in which the LED chip is not embedded in the transparent material.

TABLE 1

| resin shape | d | r/a | relative emission intensity (total radiant quantity ratio) |
|---|---|---|---|
| no resin | — | — | 1 |
| flat | 0.85 | ∞ | 1.05 |
| small convex | 1.25 | 2.78 | 1.18 |
|  | 1.25 | 2.78 | 1.12 |
|  | 1.15 | 3.65 | 1.14 |
| large convex | 1.60 | 1.61 | 1.27 |
|  | 1.70 | 1.46 | 1.26 |
|  | 1.70 | 1.46 | 1.21 |

TABLE 2

| resin shape | d | r/a | relative emission intensity (total radiant quantity ratio) |
|---|---|---|---|
| no resin | — | — | 1 |
| flat | 0.85 | ∞ | 0.934 |
| large convex | 1.70 | 1.46 | 0.831 |

FIGS. 4A, 4B, 5A, 5B, 6A and 6B respectively show radiation angle distributions of XY profiles and radiation angle distributions of angle profiles of blue LED packages (r/a=∞, 2.78, 1.46). FIGS. 7A and 7B show radiation angle distribution of XY profiles and radiation angle distribution of angle profile of white LED package (r/a=∞). Both of the blue LED package with a ratio r/a of ∞ shown in FIGS. 4A, 4B and the white LED package with a ratio r/a of ∞ shown in FIGS. 7A, 7B had almost same luminous intensities (cd:candela) in vertical direction (0°) and horizontal direction (90°), and radiation angle distributions of them also had an almost same extension.

Figure 4:
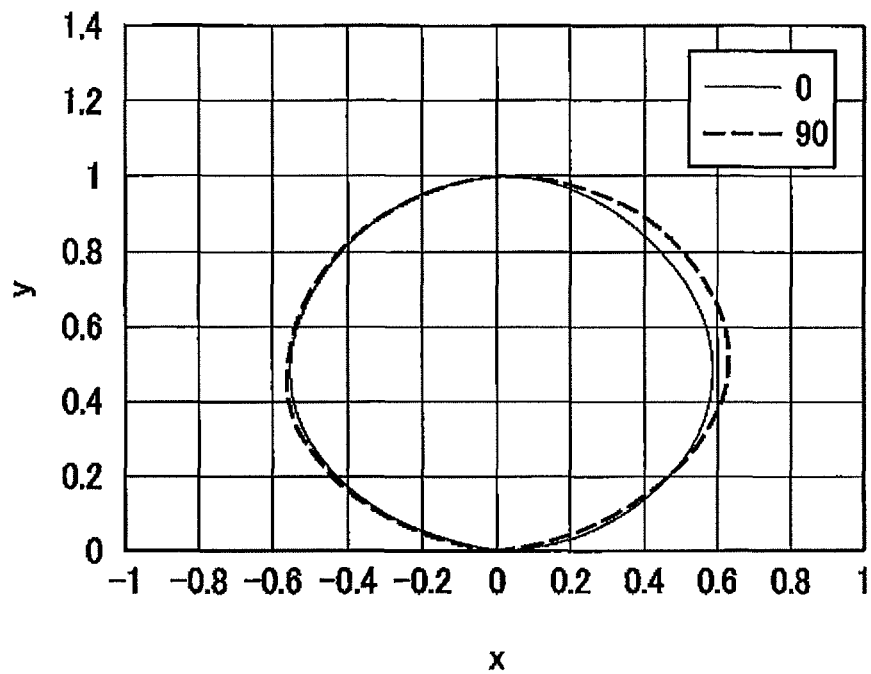
FIG. 4A is a graph showing a radiation angle distribution (XY profile) of blue LED packages (r/a=∞) and FIG. 4B is a graph showing a radiation angle distribution (angle profile) of blue LED packages (r/a=∞).
Figure 4:
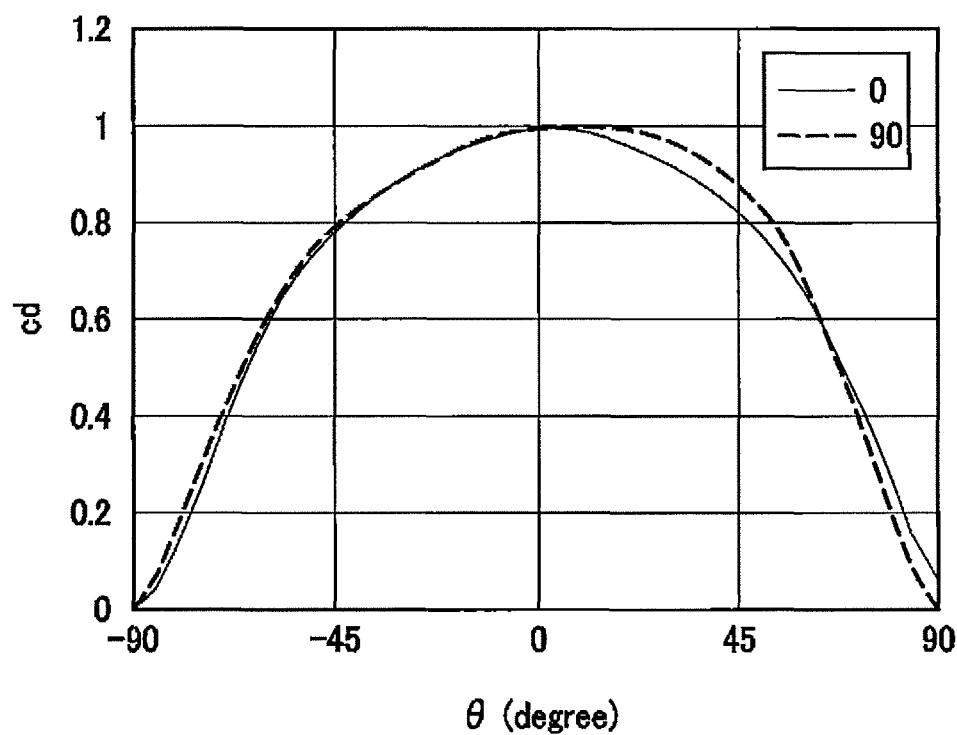
Figure 5:
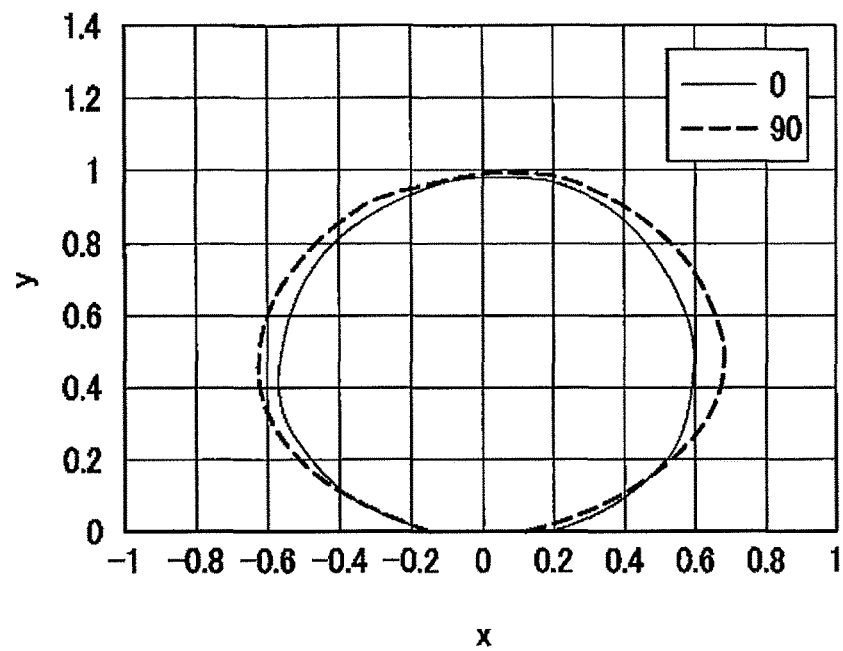
FIG. 5A is a graph showing a radiation angle distribution (XY profile) of blue LED packages (r/a=2.78)
FIG. 5B is a graph showing a radiation angle distribution (angle profile) of blue LED packages (r/a=2.78).
Figure 5:
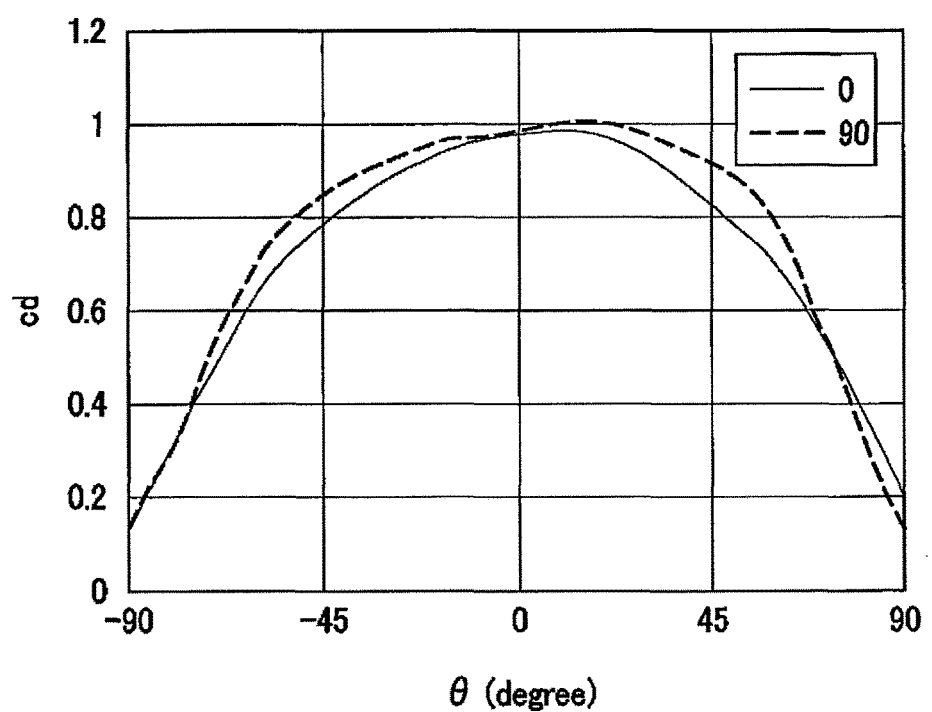
Figure 6:
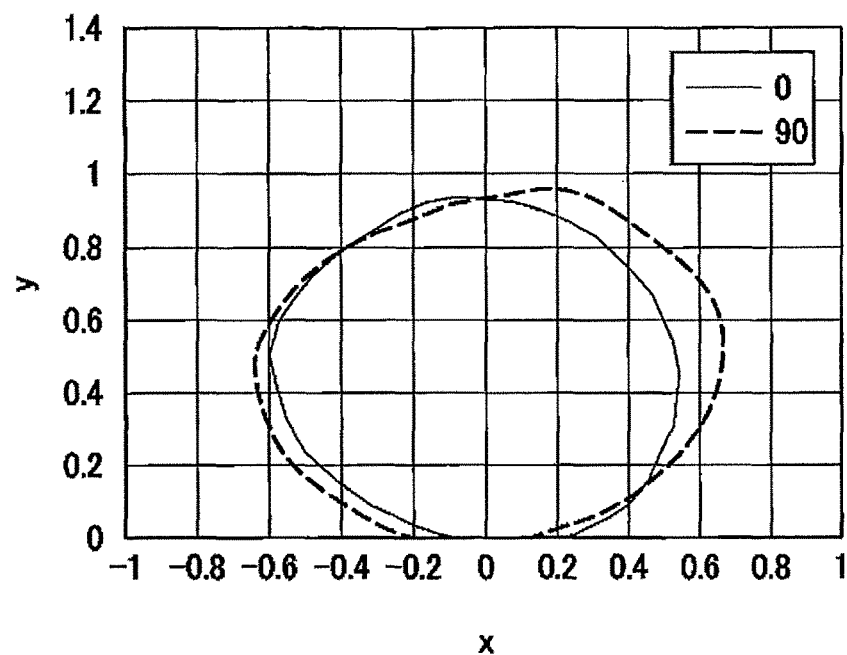
FIG. 6A is a graph showing a radiation angle distribution (XY profile) of blue LED packages (r/a=1.46)
FIG. 6B is a graph showing a radiation angle distribution (angle profile) of blue LED packages (r/a=1.46).
Figure 6:
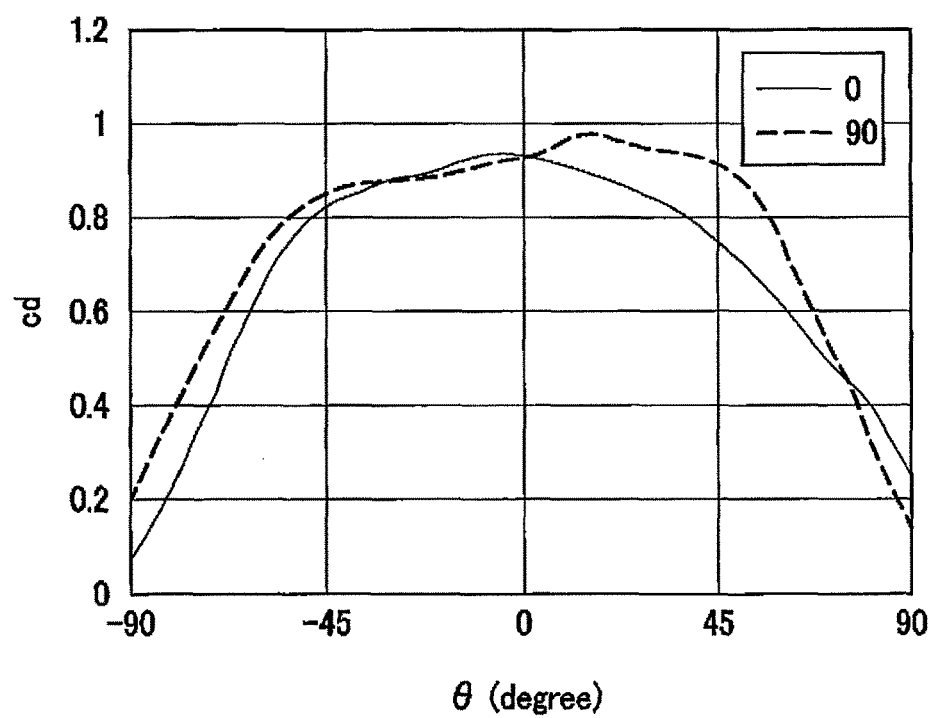
Figure 7:
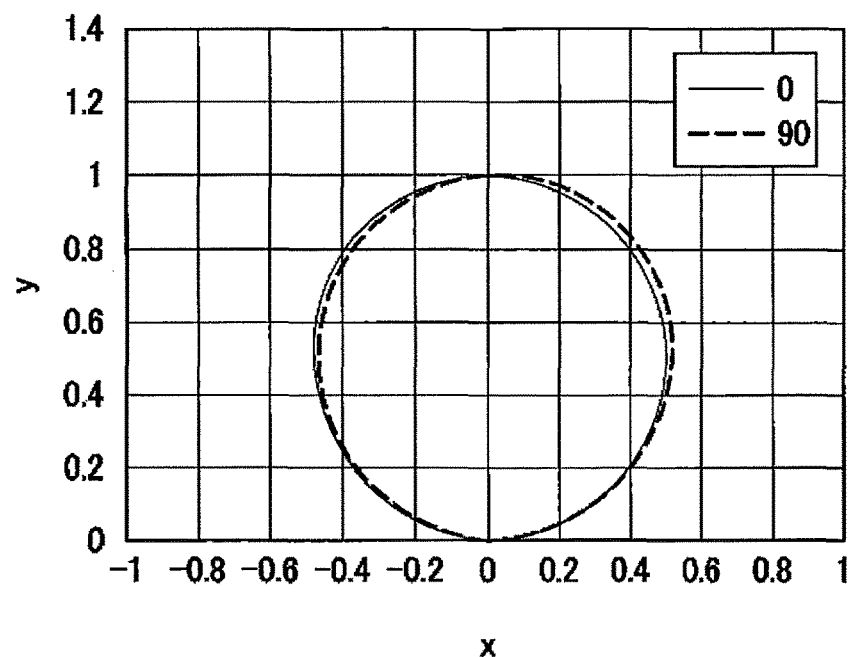
FIG. 7A is a graph showing a radiation angle distribution (XY profile) of white LED packages (r/a=∞) and FIG. 7B is a graph showing a radiation angle distribution (angle profile) of white LED packages (r/a=∞).
Figure 7:
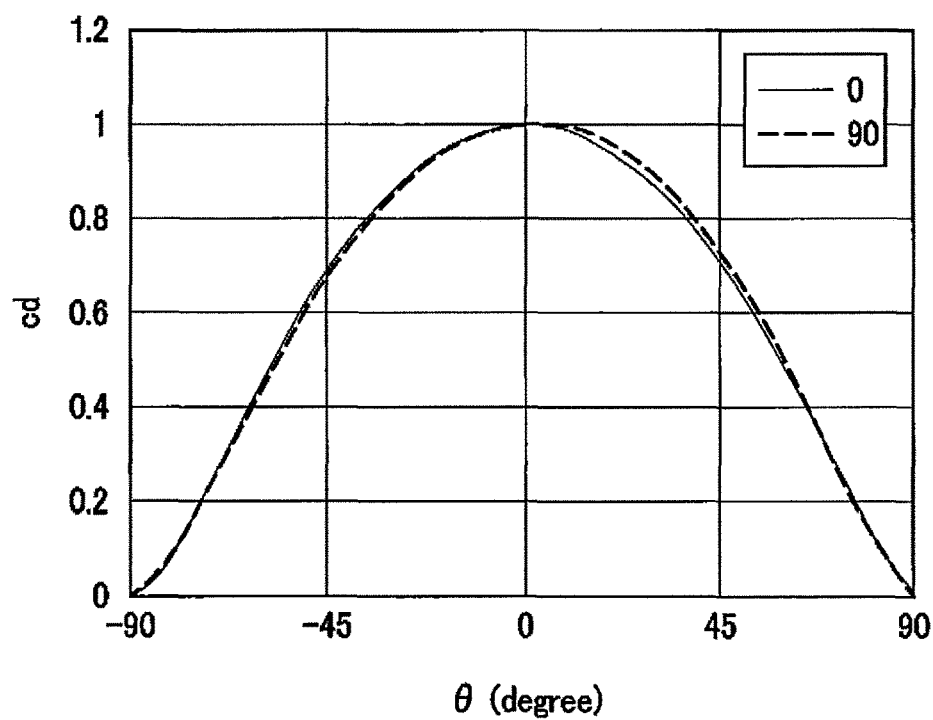

Moreover, as shown in FIGS. 4B, 5B and 6B, as the ratio r/a of the blue LED packages decreased in the order of ∞, 2.78, 1.46, the luminous intensities in horizontal direction (90°) and the extension of the radiation angle distributions increased.

Furthermore, as shown in table 1, the relative emission intensity of the blue LED package increased as the ratio r/a thereof decreased (as the convexity of the transparent resin increased). For example, the blue LED packages with the ratio r/a of 4.0 or less had relative emission intensities higher than that of the flat blue LED package with the ratio r/a of ∞. In addition, the blue LED packages with the ratio r/a of 1.7 or less had relative emission intensities of 1.2 or more. In contrast, as shown in table 2, the relative emission intensity of the white LED package decreased as the ratio r/a thereof decreased (as the convexity of the transparent resin increased).

These results reveal that the effect of the convex surface shape of the transparent resin that increases the extension of the light radiated from the LED package and improves relative emission intensity is a phenomenon specific to the blue LED package. Since there is no reflection of the phosphor within the transparent resin in the blue LED package, the convex surface shape of the transparent resin improves efficiency of extracting light to the outside.

<Evaluation Depending on Structure of LED Package>

Figure 8:
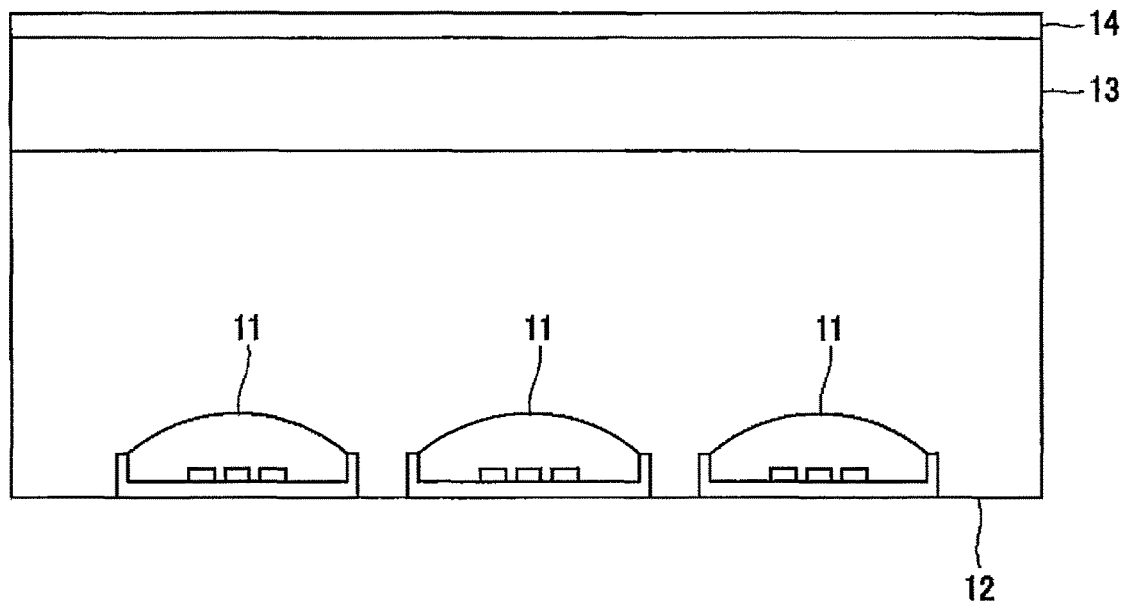
FIG. 8 is a schematic cross-sectional view of an illumination apparatus of a practical example.
Figure 9:
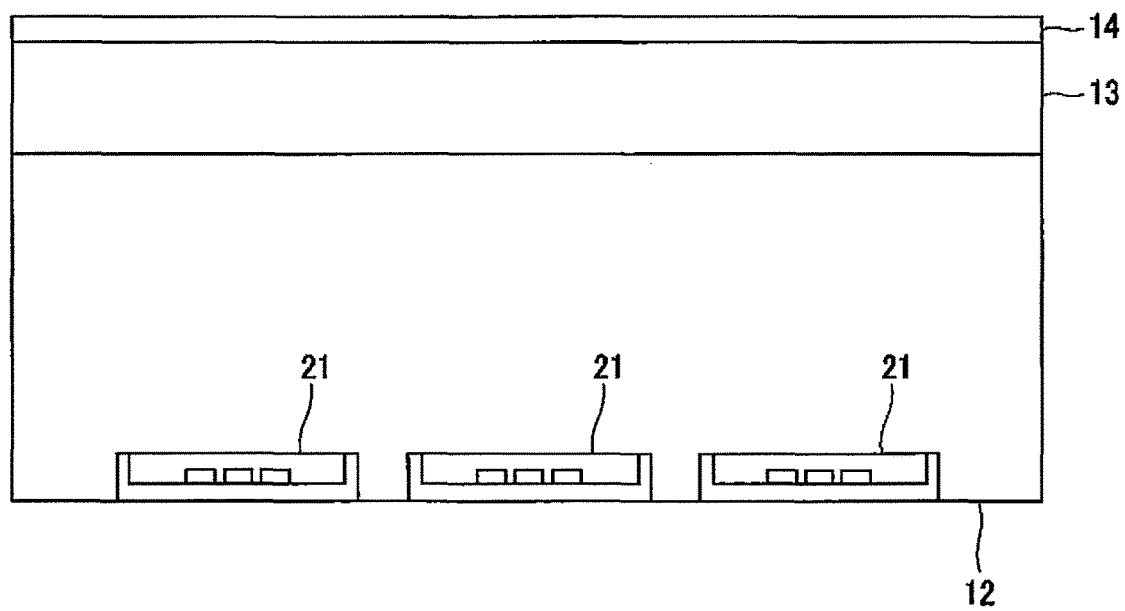
FIG. 9 is a schematic cross-sectional view of an illumination apparatus of a reference example.
Figure 10:
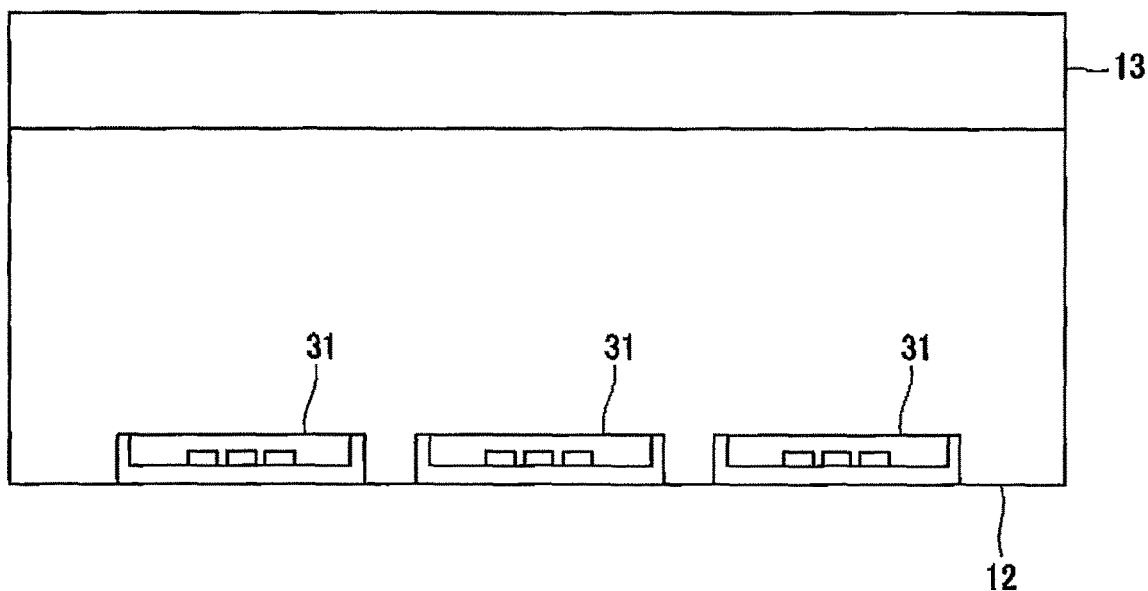
FIG. 10 is a schematic cross-sectional view of an illumination apparatus of a comparative example.

After manufacturing practical example, reference example and comparative example respectively shown in FIGS. 8 to 10, brightnesses of the illumination apparatus were evaluated. It should be noted that reference numbers in these figures are same as those of the illumination apparatus shown in FIG. 1, and the same explanation is not repeated herein.

[Constitution of Practical Example of Illumination Apparatus]

Similarly to the illumination apparatus shown in FIG. 1, the practical example of the illumination apparatus shown in FIG. 8 comprises light-emitting structures 11 in which a blue light-emitting element is embedded in a transparent resin having a convex surface shape, a substrate 12 on which the light-emitting structures 11 are disposed two-dimensionally, a diffuser plate 13 that diffuses the blue light of the blue light-emitting element, and a phosphor sheet 14 disposed at a position spaced from the substrate 12 and containing phosphor particles that obtain white light from the blue light of the blue light-emitting element.

Blue LED packages embedded in a transparent resin having a convex surface shape with the ratio r/a of 1.46 were used as the light-emitting structure 11. A methylsilicone resin was used as the transparent resin. Forty (8 by 5) blue LED packages were arranged on the substrate 12 at a pitch of 30 mm by 30 mm. A diffuser plate having a thickness of 1.5 mm, a size of A4 and a total light transmittance of 65% was used as the diffuser plate 13. The distance between the substrate 12 and the diffuser plate 13 was 12 mm, and a phosphor sheet was disposed on the diffuser plate 13.

The phosphor sheet 14 was prepared by the following process. Firstly, 100 parts by mass of toluene, 40 parts by mass of hydrogenated styrene-ethylene-butylene-styrene block (hydrogenated SEBS) copolymer (SEPTON 9527, Kuraray Co., Ltd.) and 0.5 parts by mass of maleic anhydride were uniformly mixed to obtain a mixture, and then 2 parts by mass of $SrGa_2S_4$:Eu (sulfide phosphor) with an average diameter of 6 μm was uniformly dispersed in the mixture to prepare resin composition for forming green phosphor sheet.

Resin composition for forming red phosphor sheet was prepared by the same process as the above except that CaS:Eu (sulfide phosphor) with an average diameter of 9 μm was used instead of $SrGa_2S_4$:Eu (sulfide phosphor) with an average diameter of 6 μm.

Next, a green phosphor resin layer was formed by applying the resin composition for forming green phosphor sheet on a polyethylene terephthalate film having a thickness of 25 μm (T11, Toray Industries Inc.) such that the thickness after drying would be 27 μm, and then drying them (100° C., 5 min).

Next, a red phosphor resin layer was formed by laminating a transparent separator having a thickness of 38 μm (polyethylene terephthalate film, A 4300, Toyobo Co., Ltd.) on the green phosphor resin layer and applying the resin composition for forming red phosphor sheet such that the thickness after drying would be 27 μm, and then drying them (100° C., 5 min).

Finally, the phosphor sheet corresponding to FIG. 3B was completed by laminating a polyethylene terephthalate film having a thickness of 25 μm (T11, Toray Industries Inc.) and then bonding them altogether by thermocompression (100° C., 0.2 MPa).

[Constitution of Reference Example of Illumination Apparatus]

The reference example of the illumination apparatus shown in FIG. 9 had the same constitution as that of the practical example of the illumination apparatus shown in FIG. 8 except that a blue LED package was embedded in a transparent resin having a flat surface shape with the ratio r/a of ∞ as the light-emitting structure 11.

[Constitution of Comparative Example of Illumination Apparatus]

The comparative example of the illumination apparatus shown in FIG. 10 had the same constitution as that of the practical example of the illumination apparatus shown in FIG. 8 except that a white LED package was embedded in a transparent resin having a flat surface shape with the ratio r/a of ∞ as the light-emitting structure 11 and the phosphor sheet 14 was omitted. In the white LED package, a transparent resin in which a YAG phosphor was contained in the methylsilicone resin was used.

[Evaluation of Brightness of Each Device Constitution]

Figure 11:
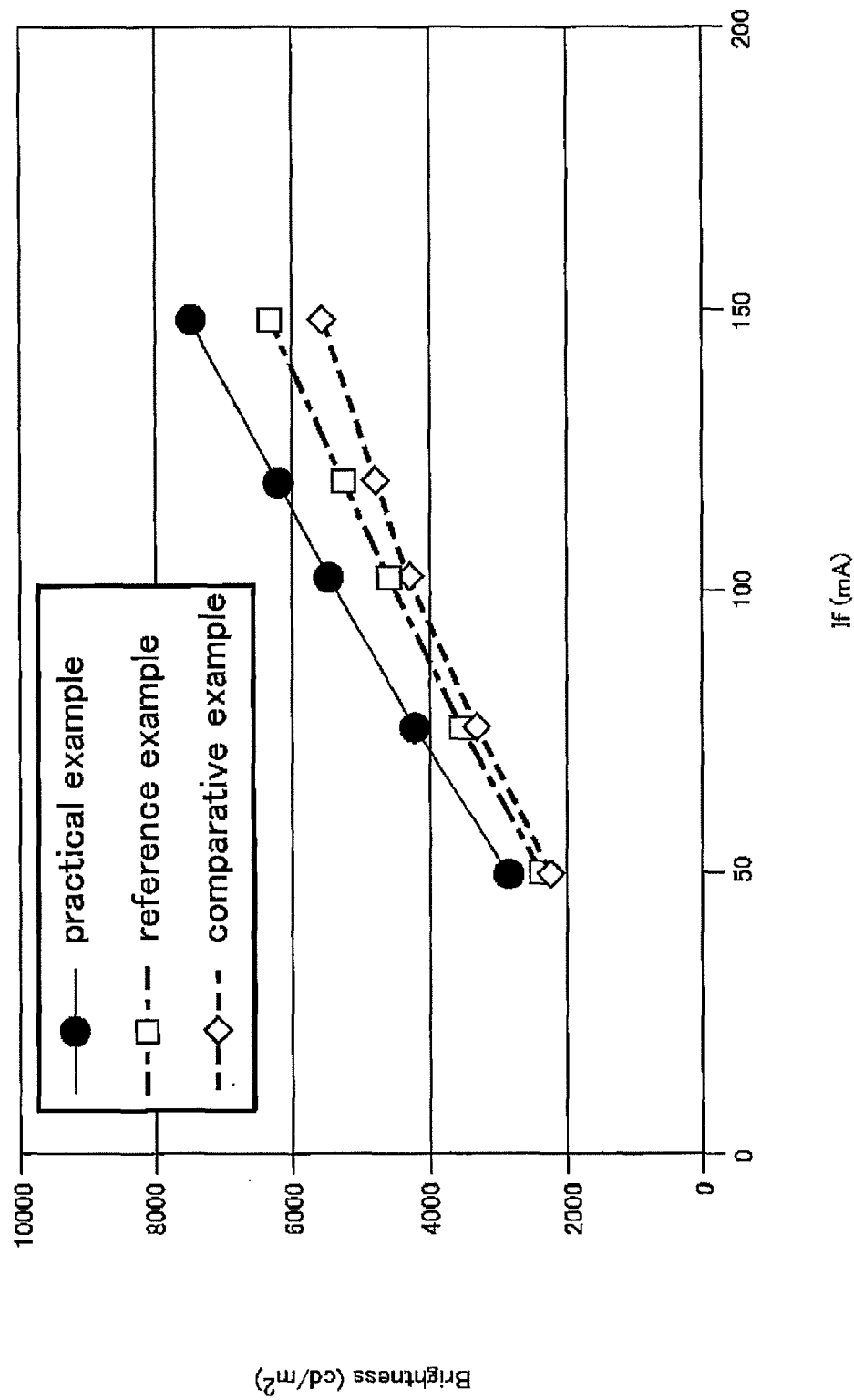
FIG. 11 is a graph showing LED driving current-brightness characteristics.

FIG. 11 shows LED driving current-brightness characteristics of the practical example, reference example and comparative example. At the LED driving current IF of 75 mA, the brightness of the practical example was improved by 26% relative to the comparative example. In addition, at the LED driving current IF of 150 mA, the brightness of the practical example was improved by 33% relative to the comparative example. Furthermore, the practical example could also improve the brightness relative to the reference example using a blue LED package embedded in a transparent resin having a flat surface shape. The reason in which the ratio of improvement at the driving current IF of 150 mA is larger than that of 75 mA is that loss of phosphor efficiency caused by the heat generation of white LED package in accordance with the increase of the driving current in the comparative example is larger than that of the practical example having a "remote phosphor structure" in which the blue LED package and the phosphor sheet are spaced from each other.

<Evaluation of Reduction in Thickness of Illumination Apparatus>

Next, brightness unevenness with respect to the distance between the substrate 12 and the diffuser plate 13 was evaluated by using the illumination apparatus of the reference example shown in FIG. 9 and the illumination apparatus of the comparative example shown in FIG. 10. LEDs were arranged on the substrate 12 at a pitch of 32 mm by 32 mm.

FIGS. 12A to 12D and FIGS. 13A to 13D are images corresponding to the distances between the substrate 12 and the diffuser plate 13 of 37 mm, 34 mm, 29 mm and 24 mm, in the illumination apparatus of the reference example and the comparative example, respectively.

Figure 12:
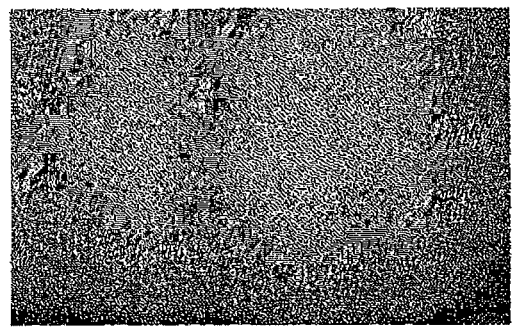
FIG. 12A is an image corresponding to the distance between the substrate and the diffuser plate of 37 mm in the illumination apparatus of the reference example.
FIG. 12B is an image corresponding to the distance between the substrate and the diffuser plate of 34 mm in the illumination apparatus of the reference example.
FIG. 12C is an image corresponding to the distance between the substrate and the diffuser plate of 29 mm in the illumination apparatus of the reference example.
FIG. 12D is an image corresponding to the distance between the substrate and the diffuser plate of 24 mm in the illumination apparatus of the reference example.
Figure 12:
Figure 12:
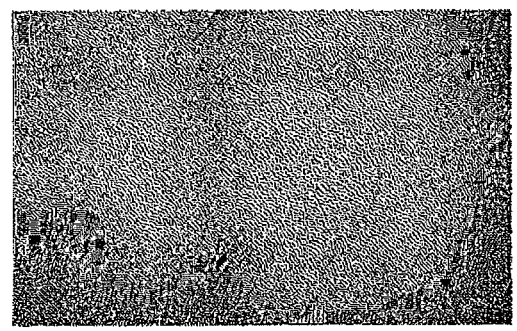
Figure 12:
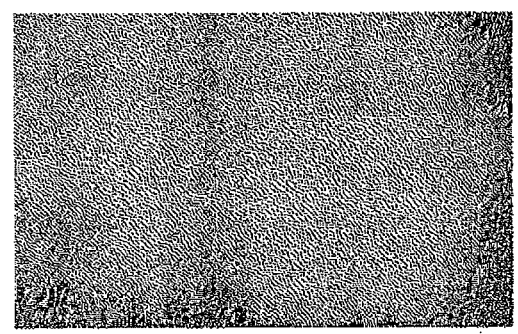
Figure 12:
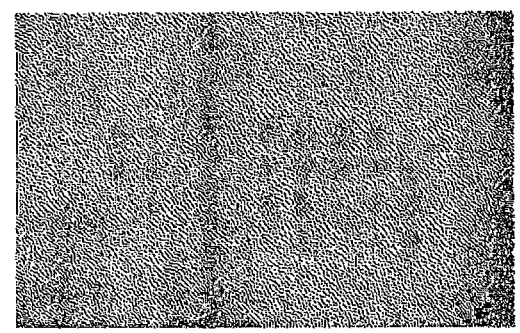
Figure 13:
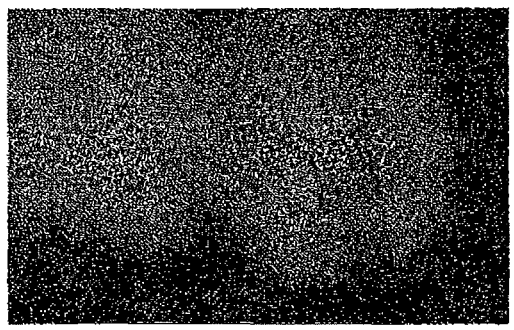
FIG. 13A is an image corresponding to the distance between the substrate and the diffuser plate of 37 mm in the illumination apparatus of the comparative example.
FIG. 13B is an image corresponding to the distance between the substrate and the diffuser plate of 34 mm in the illumination apparatus of the comparative example.
FIG. 13C is an image corresponding to the distance between the substrate and the diffuser plate of 29 mm in the illumination apparatus of the comparative example.
FIG. 13D is an image corresponding to the distance between the substrate and the diffuser plate of 24 mm in the illumination apparatus of the comparative example.
Figure 13:
Figure 13:
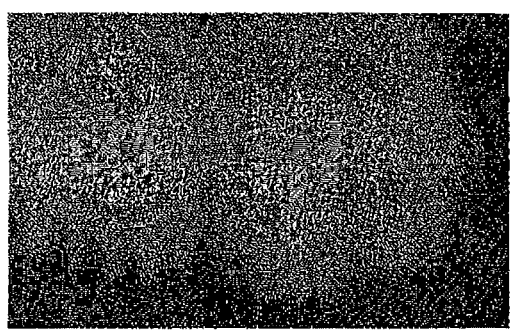
Figure 13:
Figure 13:
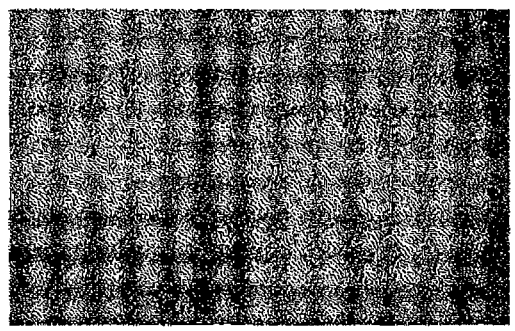

In the case of the distance between the substrate 12 and the diffuser plate 13 of 29 mm shown in FIG. 12C, the brightness unevenness was small; on the other hand, in the case of the distance between the substrate 12 and the diffuser plate 13 of 29 mm shown in FIG. 13C, the brightness unevenness was large. This reveals that the thickness of the illumination apparatus using the blue LED package and the phosphor sheet can be reduced in comparison with the illumination apparatus using the white LED package containing phosphor.

Figure 14:
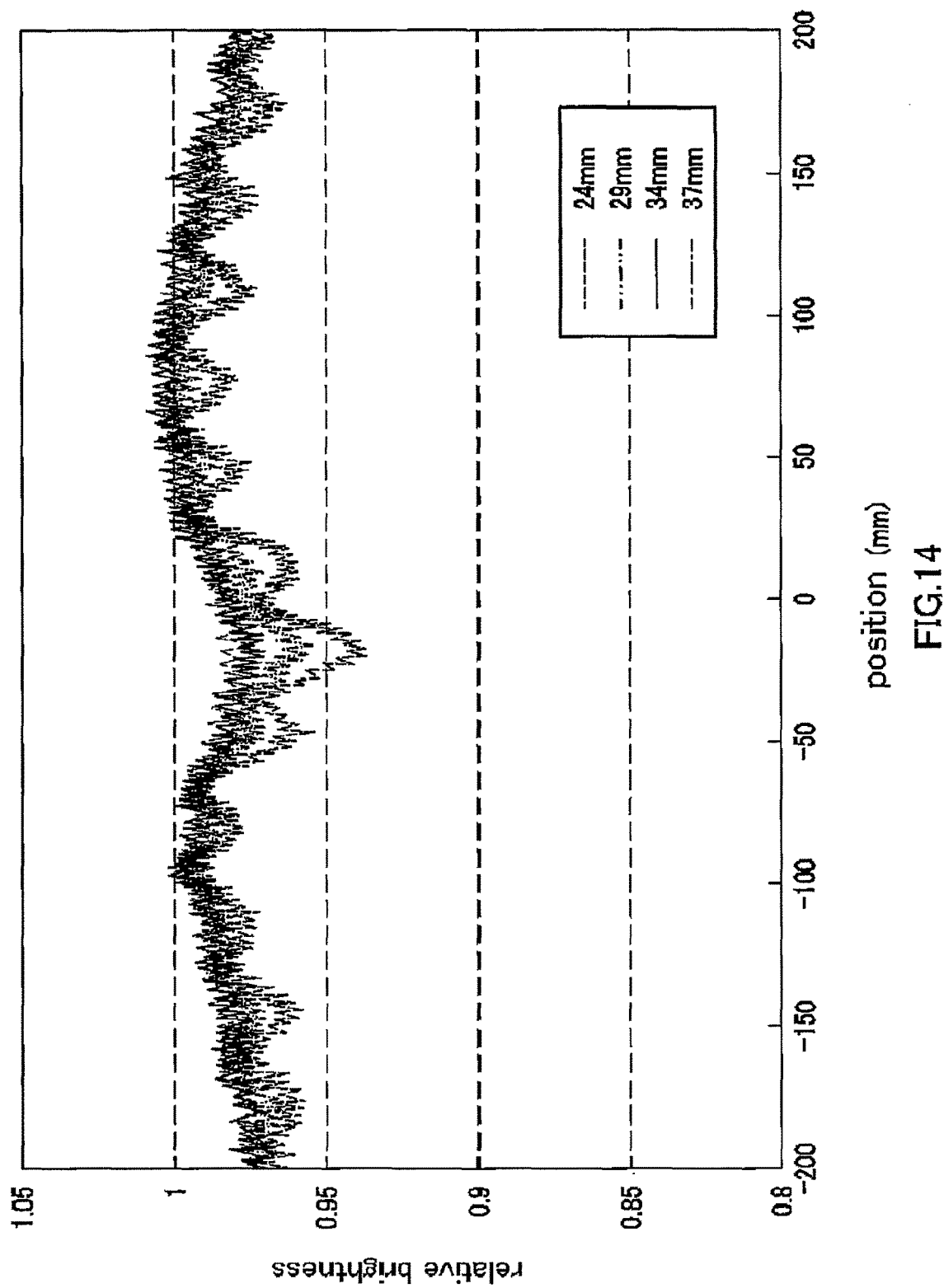
FIG. 14 is a graph showing relative brightness of an emission surface in the case of the illumination apparatus of the reference example with the phosphor sheet.
Figure 15:
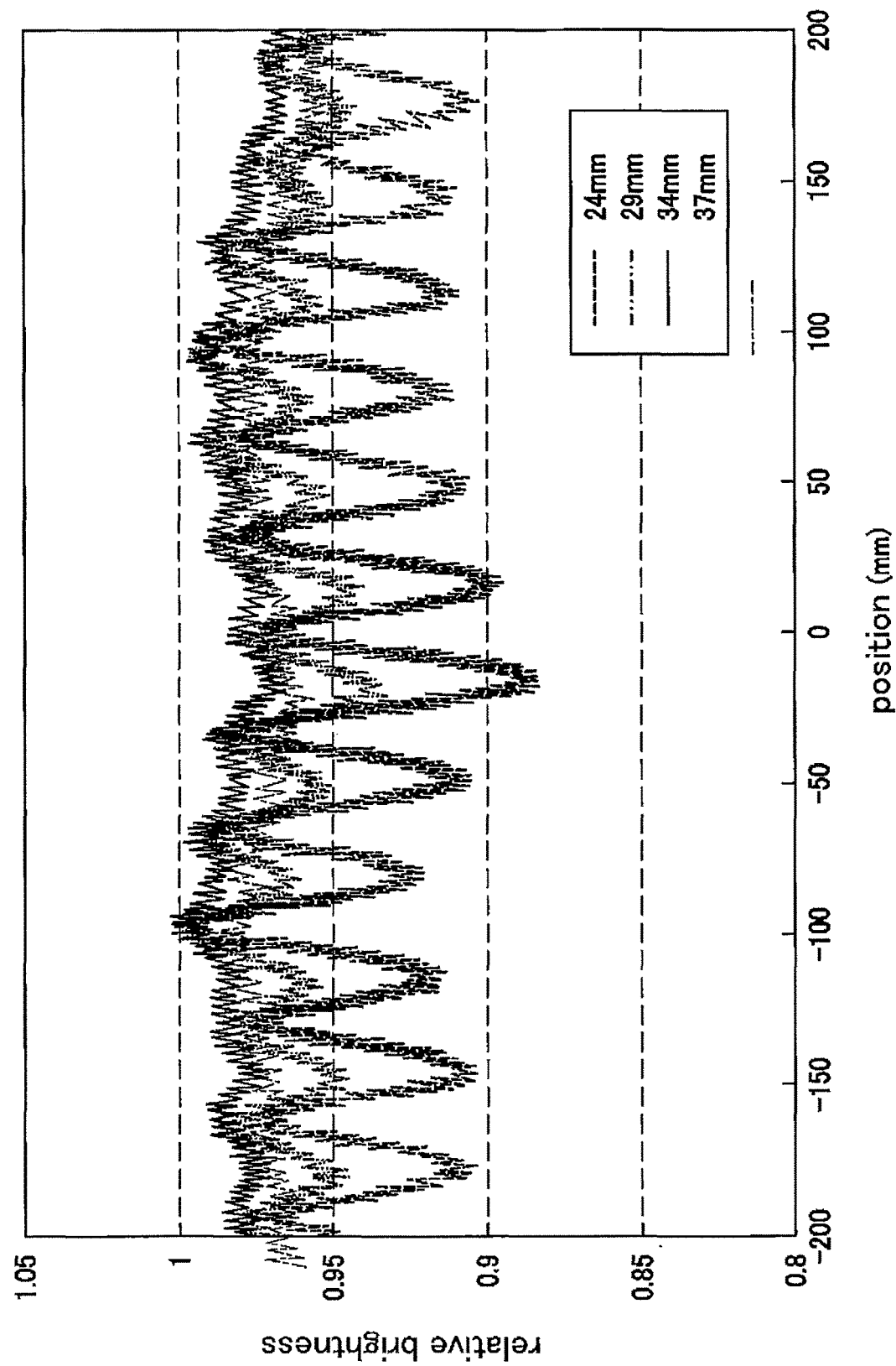
FIG. 15 is a graph showing relative brightness of an emission surface in the case of the illumination apparatus of the reference example without the phosphor sheet.
Figure 16:
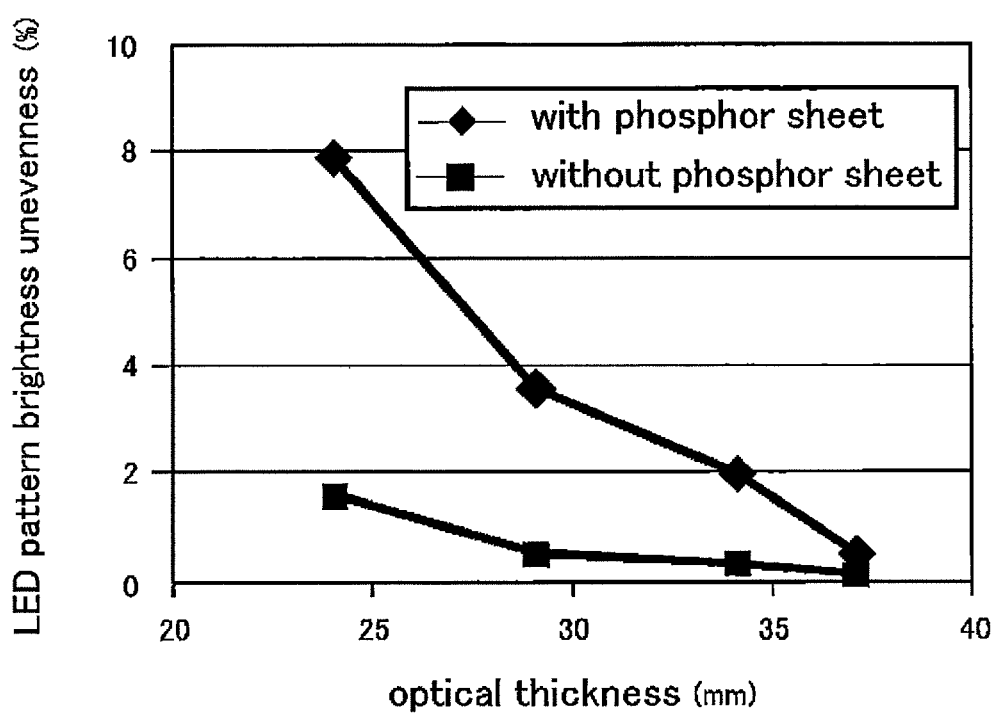
FIG. 16 is a graph showing brightness unevennesses (%) of LED patterns in the case of the illumination apparatus of the reference example with the phosphor sheet 14 and in the case of illumination apparatus without the phosphor sheet 14.
Figure 17:
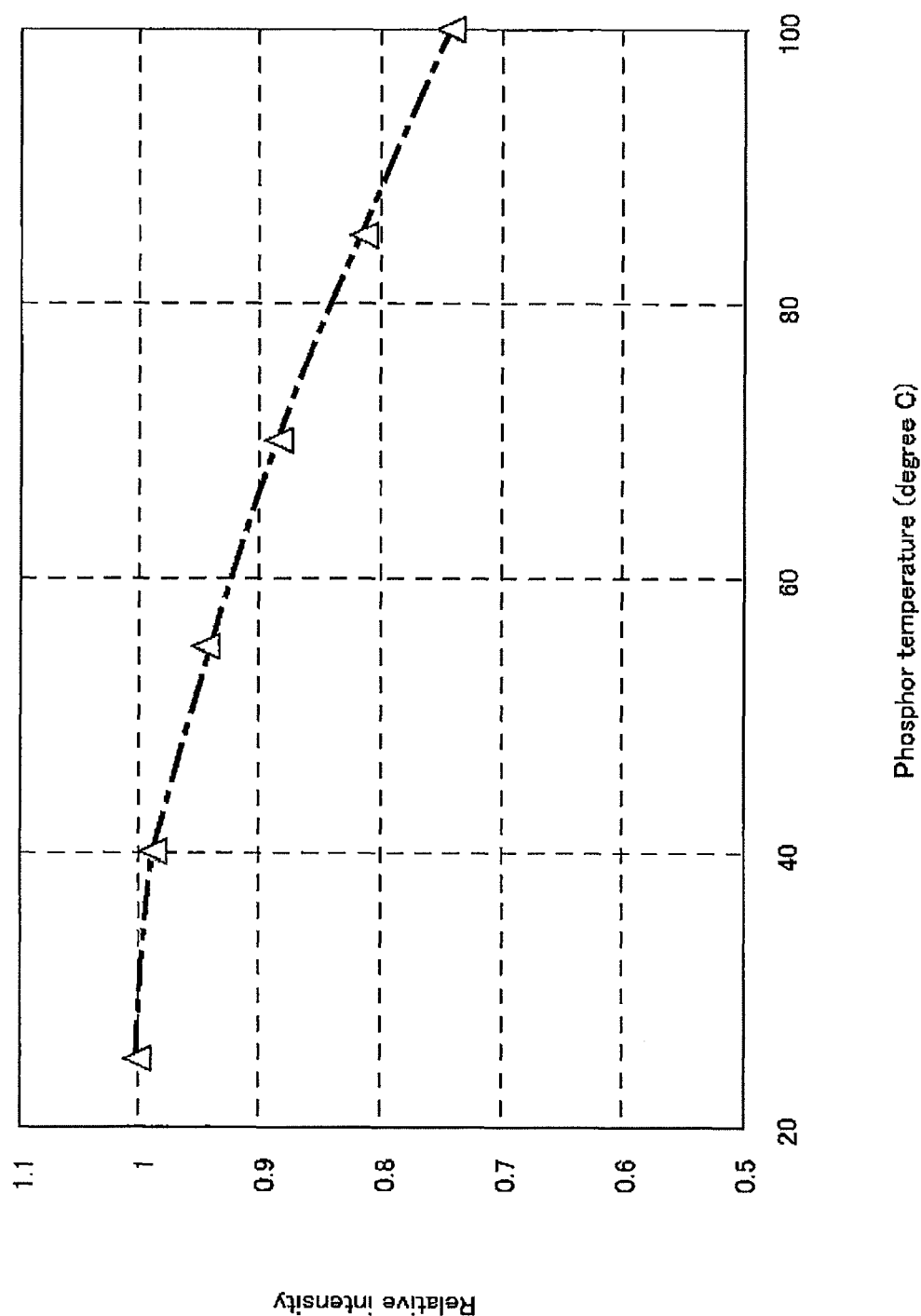
FIG. 17 is a graph showing measured data of temperature quenching of a $Y_3AlO_2$:Ce(YAG) phosphor.

FIGS. 14 and 15 are graphs respectively showing relative brightnesses of emission surfaces in the case of the illumination apparatus of the reference example with the phosphor sheet 14 and in the case of illumination apparatus without the phosphor sheet 14. FIG. 16 is a graph showing brightness unevennesses (%) of LED patterns in the case of the illumination apparatus of the reference example with the phosphor sheet 14 and in the case of illumination apparatus without the phosphor sheet 14. It should be noted that the values of the relative brightnesses are relative values assuming the value of the brightest portion is 1. On the other hand, the brightness unevennesses (%) of LED patterns were calculated from the highest intensity (Top Intensity) and the lowest intensity (Bottom Intensity) by using the following formula:

brightness unevennesses(%)=(Top Intensity−Bottom intensity)/average intensity.

FIGS. 14 to 16 demonstrate that, in order to suppress brightness unevenness of a emission surface to 2% or less, the distance (optical thickness) between the substrate 12 and the diffuser plate 13 must be 34 mm or more in the case of the illumination apparatus having no phosphor sheet 14, and the distance (optical thickness) between the substrate 12 and the diffuser plate 13 can be 24 mm in the case of the illumination apparatus having phosphor sheet 14, thus proving that the phosphor sheet in this embodiment has a substantial light-scattering effect.

The above results revealed that the convex surface shape of the transparent resin improved efficiency of extracting blue light to the outside. Moreover, owing to the light-radiation distribution broadened by the convex surface shape of the transparent resin and the light-scattering effect of the phosphor sheet containing phosphor particles, the gap distance between the substrate and the phosphor sheet can be small such that the thickness of the apparatus having so-called "remote phosphor structure" can be reduced.

REFERENCE SIGNS LIST 11 light-emitting structure, 12 substrate, 13 diffuser plate, 14 phosphor sheet, 15 optical film, 111 base material, 112 LED chip, 113 transparent resin, 114 phosphor layer, 142 transparent base material, 142 sealing film

The invention claimed is:

1. An illumination apparatus, comprising:
   light-emitting structures in which a blue light-emitting element is embedded in a transparent resin;
   a substrate on which the light-emitting structures are disposed two-dimensionally; and
   a phosphor sheet disposed at a position spaced from the substrate and containing phosphor particles that obtain white light from blue light of the blue light-emitting element, wherein
   in each light-emitting structure, the blue light-emitting element is mounted on a base material,
   a height b of an inner wall formed at peripheral edges of the base material is equal to or greater than the thickness of the blue light-emitting element,
   a height d of the transparent resin is greater than the height b of the inner wall,
   the transparent resin is formed in a convex surface shape, and
   the convex surface shape is expressed by a ratio r/a that is between 1.46 and 1.7, "r" being a radius of curvature of the convex surface shape, and "a" being half of the width of the transparent resin in contact with the base material.

2. The illumination apparatus according to claim 1, wherein the phosphor sheet comprises at least one type of phosphor selected from the group consisting of sulfide-based phosphor, oxide-based phosphor and mixture thereof, and a resin component selected from the group consisting of a polyolefin copolymer component and a light curing (meth) acrylic resin component.

3. The illumination apparatus according to claim 2, wherein a polyolefin copolymer component is selected as a resin component, and further comprising a phosphor layer formed by depositing a resin composition containing a maleic anhydride.

4. The illumination apparatus according to claim 2, wherein the phosphor sheet is formed by sandwiching the phosphor layer between a pair of transparent base materials and laminating both side with sealing films.

5. The illumination apparatus according to claim 1, further comprising:
   a diffuser plate disposed between the substrate and the phosphor sheet.

6. A display apparatus comprising the illumination apparatus according to claim 1 disposed at an image display panel.

7. The illumination apparatus according to claim 1, wherein a difference between the height b and the height d is equal to or greater than 0.3 mm.

* * * * *